US008780418B1

(12) United States Patent
Bluzer et al.

(10) Patent No.: US 8,780,418 B1
(45) Date of Patent: Jul. 15, 2014

(54) SCANNING FOCAL PLANE SENSOR SYSTEMS AND METHODS FOR IMAGING LARGE DYNAMIC RANGE SCENES

(71) Applicants: Nathan Bluzer, Rockville, MD (US); Bron R. Frias, Catonsville, MD (US); Paul A. Tittel, Columbia, MD (US)

(72) Inventors: Nathan Bluzer, Rockville, MD (US); Bron R. Frias, Catonsville, MD (US); Paul A. Tittel, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 13/838,054

(22) Filed: Mar. 15, 2013

(51) Int. Cl.
| | |
|---|---|
| H04N 1/04 | (2006.01) |
| H04N 1/60 | (2006.01) |
| H04N 1/024 | (2006.01) |
| G01D 18/00 | (2006.01) |
| G06K 9/20 | (2006.01) |
| H04N 5/217 | (2011.01) |
| G01C 19/00 | (2013.01) |

(52) U.S. Cl.
USPC ......... 358/482; 358/1.9; 358/473; 250/252.1; 382/312; 348/241; 702/104

(58) Field of Classification Search
USPC ........ 250/252.1; 382/312; 348/241; 358/482, 358/1.9, 473; 702/104
See application file for complete search history.

(56) References Cited

U.S. PATENT DOCUMENTS

| | | | |
|---|---|---|---|
| 6,249,360 B1* | 6/2001 | Pollard et al. | 358/473 |
| 6,782,334 B1* | 8/2004 | Eller et al. | 702/104 |
| 7,221,486 B2* | 5/2007 | Makihira et al. | 358/486 |
| 8,463,078 B2* | 6/2013 | Goodnough et al. | 382/312 |
| 8,481,918 B2* | 7/2013 | Nikittin | 250/252.1 |
| 2003/0030853 A1* | 2/2003 | Makihira et al. | 358/486 |
| 2010/0155587 A1* | 6/2010 | Nikittin | 250/252.1 |
| 2011/0115793 A1* | 5/2011 | Grycewicz | 345/428 |
| 2011/0299104 A1* | 12/2011 | Seo et al. | 358/1.9 |
| 2012/0194711 A1* | 8/2012 | Nikittin | 348/241 |
| 2012/0287256 A1* | 11/2012 | Hulsken et al. | 348/79 |
| 2013/0077134 A1* | 3/2013 | Compton et al. | 358/482 |

\* cited by examiner

*Primary Examiner* — Charlotte M Baker
*Assistant Examiner* — Rury Grisham
(74) *Attorney, Agent, or Firm* — Tarolli, Sundheim, Covell & Tummino LLP

(57) ABSTRACT

A scanning focal plane sensor and method are described for image capturing of object space (or scenes). In one example, a focal plane sensor for a scanning imaging system is provided. The focal plane sensor for a scanning imaging system includes M×N Time Delay Integration (TDI) imaging Charge Coupled Device (CCD), where M is a number of TDI columns and N is a number of TDI stages per each column. A detector is connected to each TDI stage. The focal plane sensor includes an imaging controller configured to mechanize sampling the brightness value of each sensor pixel's initial footprint in object space and select a number of charge integrating TDI stages for substantially equalizing the inter sensor pixels' signal to noise ratios.

24 Claims, 8 Drawing Sheets

SCANNING FOCAL PLANE SENSOR SYSTEMS AND METHODS FOR IMAGING LARGE DYNAMIC RANGE SCENES

TECHNICAL FIELD

The present invention relates to focal plane sensors, and more particularly to systems and methods for imaging large dynamic range scenes via scanning focal plane sensors.

BACKGROUND

Scanning Imaging systems have focal plane sensors operating in different spectral bands (for example, Ultraviolet (UV), or Visible, or Short Wavelength Infrared (SWIR), or Mid Wavelength Infrared (MWIR), or Long Wavelength Infrared (LWIR)) that have difficulty imaging scenes with large dynamic range. Object space, or scene, are imaged with focal plane sensors which contain many sensor pixels, where each sensor pixel consists of a photodetector with readout provisions. Focal plane sensors image a scene by virtually dividing it into small areas where each small area is the footprint of a sensor pixel in object space (or the scene). Large dynamic range scenes contain regions which when imaged with sensor pixels will exhibit very large, or average, or very low photosignals. Characteristically, imaging such scenes has three problems: (i) sensor pixel's overexposure, or underexposure, (ii) digitization of large dynamic range signals (>15 bits), and (iii) poor sensitivity in overexposed or underexposed sensor pixels. Adjusting globally the integration time to optimize the image according the average scene brightness is not an adequate solution for imaging large dynamic range scenes. The average brightness approach is utilized for film imaging, and is most effective for low dynamic range scenes, but inadequate for imaging large dynamic range scenes.

Recently, another approach has been introduced for imaging high dynamic range scenes which combines multiple images, each taken at a different exposure. Multiple images are merged with a software program into a single combined image. The combined image merges dim image regions (acquired with the longest exposure) with average brightness image regions (acquired with intermediate exposure) with very bright image regions (acquired with short exposure). Software is used to selects sensor pixels with the best exposure (signal to noise ratio) and after proper scaling, the software combines the selected sensor pixels into a single surreal image. The combined image produced from multiple exposures and post processing can be effective for imaging large dynamic range scenes, however, it has serious drawbacks. First, multiple images require more time and are appropriate for slow scenes, and not faster scenes. Second, combining multiple images requires sensor pixel to sensor pixel registering in multiple images, otherwise blurring will occur. These additional requirements limit the utility of the multiple image approach to situation where: (1) a tripod is used for good stability between the camera and scene, and (2) the scene does not change rapidly.

The problem of imaging large dynamic range scenes is illustrated by the example in TABLE 1. The scene's dynamic range entered in the second column is divided into five subranges. Such division illustrates several characteristics of imaging with focal plane sensors containing quantum photodetectors with readout provisions. First, signals from large dynamic range scenes have photosignals which vary over a wide dynamic range (see column 2 in TABLE 1) and the signal to noise ratio varies according to Poisson statistics as the square root of the signal (see column 3 in TABLE 1). Poor sensitivity occurs because the S/N decreases monotonically as the square root of the signal. At the highest signal levels, sensor pixel saturation can occur and lead to poor sensitivity. Second, sensitivity dependence of a sensor pixel's photosignal complicates digitizing signals from large dynamic range scenes. Typically, an analog-to-digital (A/D) convertor's least significant bit (LSB) is adjusted to equal approximately the signal's noise level. It is difficult to define a global LSB value for an imaging focal plane sensor because each sensor pixel's noise varies with photosignal (see column 3 in TABLE 1). This would require varying the A/D LSB for each range (see column 5 in TABLE 1) which raises many complications. Conventionally, the A/D converters LSB is set at the minimum noise level and that causes inefficient A/D converter operation since significant time is consumed digitizing noise. Third, in large dynamic range images the signal-to-noise (S/N) ratio is maximum in scene regions with high photosignals and minimum in regions with low photosignals (see column 4 in TABLE 1). This effect translates into noticeable variation in image quality wherein the best (poorest) image quality is in regions where the sensor pixels have high (low) level photosignal.

TABLE 1 below is an example of the signal levels expected in focal plane sensors with quantum photodetectors. Each sensor pixel is subjected to the same integration time and field of view. After one integration time, the integrated charge photosignal in each sensor pixel is assumed to vary between 12 and 12,500 photoelectrons. The signals dynamic range has been divided into five subranges to illustrate how a sensor pixel's noise and S/N ratio varies with signal (see, respectively, third and fourth columns). Digitizing signals with different noise levels complicates selecting an optimal value for the A/D converter's LSB value.

TABLE I

| Signal Range # | Un-scaled Signal Range (electrons) | Un-scaled Noise Range (electrons | Instantaneous S/N (# Bits) Before Scaling | Unsealed A/D Converter LSB (electrons) |
|---|---|---|---|---|
| 1 | 3,125-12,500 | 56-112 | <8 | 30 |
| 2 | 782-3,125 | 28-56 | <6 | 15 |
| 3 | 196-782 | 14-28 | <5 | 7 |
| 4 | 49-196 | 6-14 | <4 | 3 |
| 5 | 12-49 | 3-7 | <3 | 1.5 |

SUMMARY

In accordance with one example, a focal plane sensor for a scanning imaging system is provided. The focal plane sensor for a scanning imaging system includes M×N Time Delay Integration (TDI) imaging Charge Coupled Device (CCD), where M is a number of TDI columns and N is a number of TDI stages per each column. A detector is connected to each TDI stage. The focal plane sensor includes an imaging controller configured to mechanize sampling the brightness value of each sensor pixel's initial footprint in object space and select a number of charge integrating TDI stages for substantially equalizing the inter sensor pixels' signal to noise ratios.

In accordance with another example, the focal plane sensor is configured to perform imaging with forward and a reverse scan operation. The focal plane sensor comprises a bidirectional M×N TDI imaging CCD, where M is a number of TDI columns and each column has N TDI stages. Each TDI stage is connected to a detector and each sensor pixel's signal can selectively be increased by up to N TDI integrations. The focal plane sensor further comprises M×K sensing stages, where K is an integer greater than one, wherein a first set of sensing stages for each of the M sensor pixels resides on a first side of the bidirectional M×N TDI imaging CCD and a second set of M×K sensing stages for each of the M sensor pixels resides on a second side of the bidirectional M×N TDI imaging CCD, and an imaging controller configured to determine an initial photosignal brightness value for each sensor pixel based on an initial image capture with the first set of M×K sensing stages during a forward scan, and to determine an initial photosignal brightness value for each sensor pixel based on an initial image capture with the second M×K sensing stages during a reverse scan. The imaging controller selects a number of charge integrating TDI stages applied for each respective sensor pixel based on its respective initial photosignal brightness value.

In yet a further example, a method is provided for image capturing from an object scene by a scanning focal plane sensor. The method comprises determining an initial photosignal brightness value for each of a plurality of sensor pixels based on an initial capture of an image from an object scene, and utilizes each sensor signal's initial photosignal brightness value to determining an integration TDI scale factor. The integration TDI scale factor for each sensor pixel is based on the sensor pixel's brightness value and within which predetermined sensor pixel signal range it occupies. The integration TDI scale factor applied to each sensor pixel equalizes the inter sensor pixels' signal to noise approximately within a factor of 2.

DETAILED DESCRIPTION

Figure 1:
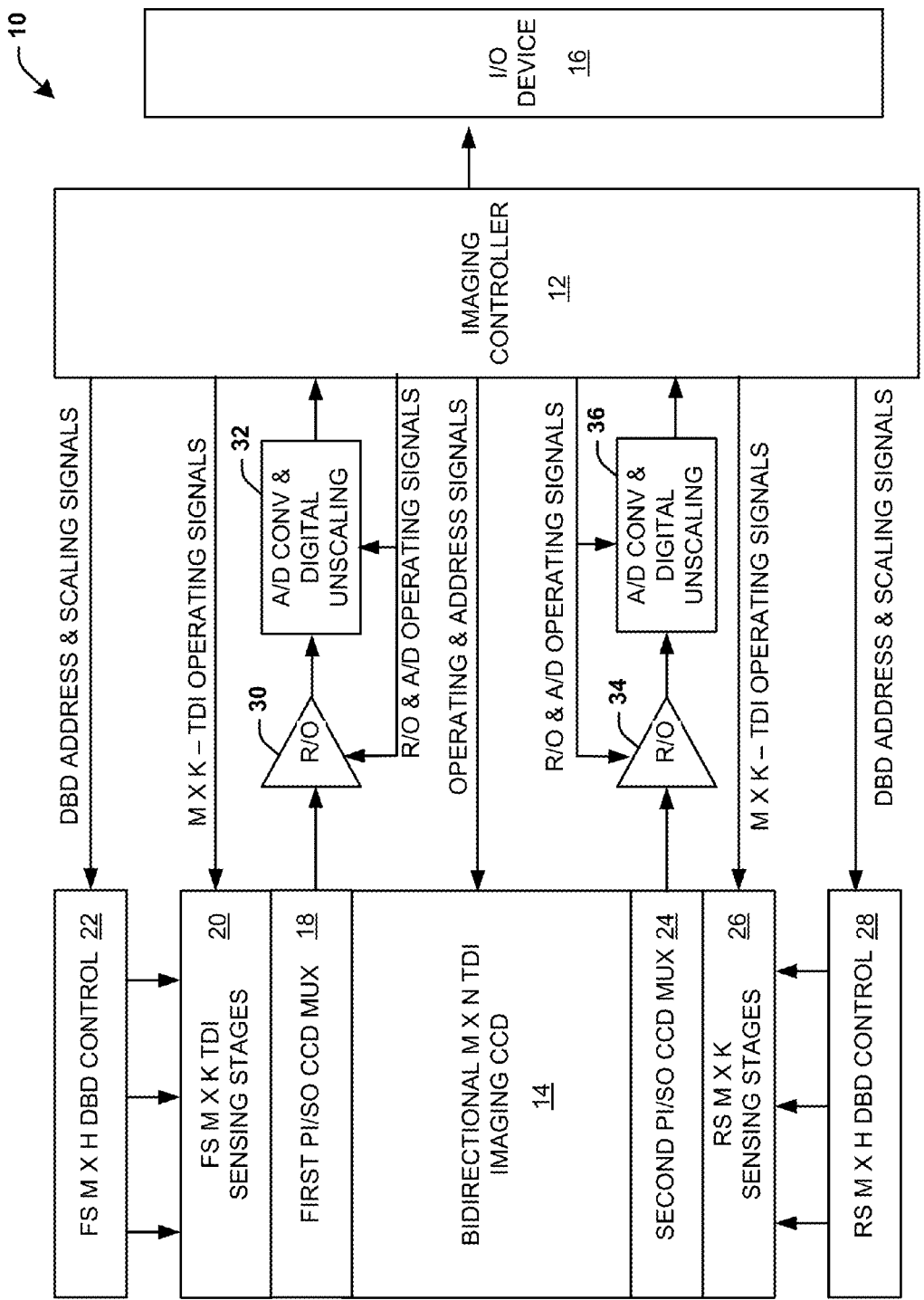
FIG. 1 illustrates an example of a functional block diagram of a focal plane sensor in a scanning imaging system.

The present disclosure provides a focal plane sensor architecture for scanning imaging systems and methods for imaging large dynamic range scenes, and providing images with substantially equalized inter sensor pixel signal to noise (S/N) ratios (e.g., within approximately 2×) irrespective of the brightness value of each sensor pixel's footprint in object space. This is accomplished by applying a digital transformation to each sensor pixel's photosignal to substantially equalize each sensor pixel's photosignal within a same brightness range and S/N ratio. The digital transformation adjusts each sensor pixel's integration time by a scaling factor which depends on a sensor pixel's initial photosignal brightness thereby scaling each sensor pixel's photosignal into a predetermined sensor pixel signal range. This substantially equalizes the S/N ratio of each sensor pixel's photosignal value to within approximately 2× of one another. Based on the scaling factor, each sensor pixel's integration time is adjusted by selecting a number of TDI stages it receives. The scaled sensor pixel value is then converted from the analog to the digital signal, thus capturing the optimized S/N ratio for each sensor pixel. The digital scaled sensor pixel value is then digitally unscaled by its respective scaling factor to recover the sensor pixel's original brightness signal while maintaining the digitally captured and equalized inter pixels S/N ratio.

The aforementioned digital transformation invented for high dynamic range imaging governs the operation and digitization of each sensor pixel in the focal plane sensor. This digital transformation satisfies two very important constraints: (1) Each sensor pixel's output signal value (neglecting global gain factors and quantization errors) remains unchanged, and (2) scaling equalizes the inter sensor pixels' signal to noise ratios approximately to within 2×. The first constraint insures that the digital transformation does not distort the image. Hence, unscaling is performed as part of digital transformation to recover and obtain a digital representation of each sensor pixel's initial photosignal value (neglecting global gain factors). This does not preclude using compression algorithms to process the high dynamic range digital images for displaying on limited dynamic range displays. The second constraint equalizes (within approximately 2×) inter sensor pixels' sensitivity and thereby insures optimal S/N ratios in sensor pixels with small, average, and large photosignals.

To maximize scan efficiency, a focal plane sensor is configured to implement bidirectional scan over an array of TDI imaging CCD columns. Each TDI imaging CCD column provides signal enhancement by operating in a time delay and integrate (TDI) mode. In this mode, the scanned image moves synchronously with the analog photosignal physically shifted inside the CCD channel. Synchronized movement of image and charge signals within the TDI-CCD channel results in build-up of the photocharge signal in the TDI-CCD channel. Photocharge signal buildup depends on the number of TDI stages applied in the TDI-CCD imaging column. This invention teaches how to vary the number of TDI-CCD stages within a TDI column used for building up of the photocharge signal.

For example, a CCD imaging column with 10 TDI stages can build up the photocharge signal by 10× over what a single TDI stage would collect. Thus in a scanning focal plane sensor with N TDI stages, the maximum effective integration time (N*TINT) depends on the product of: (1) the scanning speed of the image over the imaging TDI-CCD column (related to TINT), and (2) the number "N" which representing the number of TDI stages used to built up the photosignal in a TDI-CCD imaging column. In conventional scanning focal plane sensors the number of TDI stages can only be globally selected where every sensor pixel in the focal plane array is buildup by the same number of TDI stages per sensor pixel.

In accordance with an aspect of the present invention, a focal plane sensor/method is provided that provides advanced knowledge of each sensor pixel's photosignal value since this information is needed to determine the optimal number of TDI stages that should be applied to each sensor pixel. Additionally, a structure/method is illustrated for adjusting, in a N offstage TDI column, the effective integration time per sensor pixel by varying the number of TDI stages applied per pixel.

FIG. 1 illustrates an example of a functional block diagram of a scanning focal plane sensor for an imaging system 10. The scanning focal plane sensor for an imaging system 10 includes an imaging controller 12 configured to control the focal plane sensor for the scanning imaging system's 10 and includes provisions for capturing and processing each sensor pixel's brightness footprint in object space (scene). The focal plane sensor for the scanning image system 10 includes bidirectional M×N TDI imaging CCD 14 comprised of M TDI columns, with N TDI stages in each TDI Column. Each TDI stage is connected to a detector and the number of TDI stages applied to each sensor pixel is adjustable up to a maximum of N TDI stages.

Figure 7:
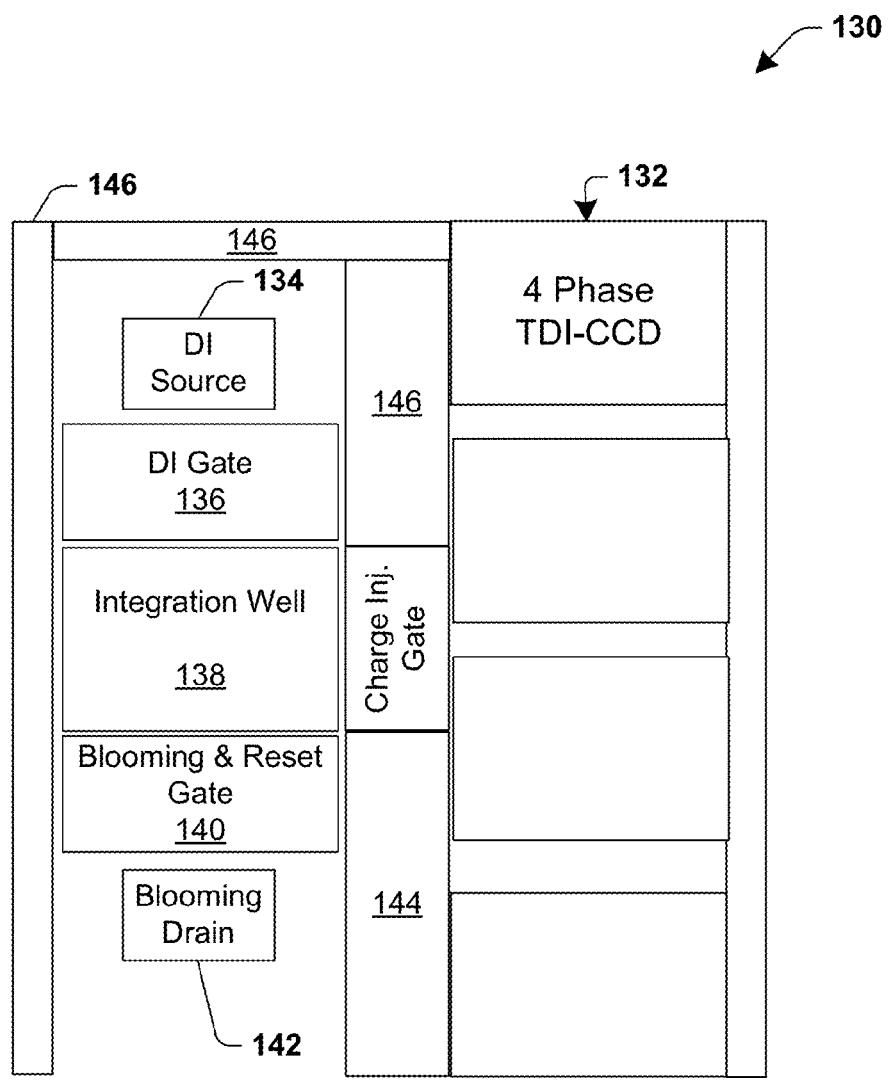
FIG. 7 illustrates an example of a sensor pixel's block diagram with a four phase TDI-CCD clocking cell, the detector is left out for clarity.

Hybrid focal plane sensors have the sensor pixels wherein the pixel's detector is made in a separate semiconductor crystals than the pixel's readout stage, and this architecture is illustrated in FIG. 7 without illustrating the sensor pixel's detector. Each sensor pixel's TDI stage includes a DI Source for connection to a pixel's detector for accepting photogenerated signals and injecting these into an Integration Well located in the TDI cell. Photogenerated charges from the integration well are moved into a TDI-CCD well for transport with and aggregation under the TDI-CCD clocking gates. Movements of signal charges from the pixel's detector into the Integration Well, the Blooming Drain, and the TDI-CCD well, are controlled by the imaging controller 12 via operating and address signals.

The imaging system 10 with the focal plane sensor can include an input/output device 16 that receives image results from the imaging controller 12 and displays them. The input/output device 16 can also provide synchronization inputs of the imaging system platform relative to the object scene, such as height, distance, speed or other parameters for synchronizing movement of projected object space images along TDI stages with movement of photogenerated image signals within the TDI-CCD columns. Movement synchronization between object space images moving along TDI stages with movement of photogenerated image signals within the TDI-CCD is mechanized for moving or stationary systems using scanning focal plane sensor controlled by the imaging controller 12.

A first parallel in/serial out (PI/SO) CCD multiplexer 18 resides on a first side of the TDI Imaging CCD 14 and a second PI/SO CCD multiplexer 24 resides on a second side of the TDI Imaging CCD 14. A plurality of forward scanning M×K TDI sensing stages 20 reside adjacent to the first PI/SO 18 and a plurality of backward scanning M×K TDI sensing stages 26 reside adjacent to the second PI/SO CCD multiplexer 24. The forward scanning M×K TDI sensing stages 20 provide the imaging controller 12 advanced knowledge of each sensor pixel's object space footprint photosignal brightness during a forward scan, where K is an integer greater than one. This information is used to determine how many TDI stages are applied to each sensor pixel while being imaged with the M×N TDI imaging CCD during a forward scan. The reverse scanning M×K TDI sensing stages 26 provide the imaging controller 12 advanced knowledge of each sensor pixel's object space footprint photosignal brightness during a reverse scan. This information is used to determine how many TDI stages are applied to each sensor pixel during a reverse scan.

In forward scan, the photogenerated charge signals from the FS M×K TDI sensing stages 20 are multiplexed by the first PI/SO CCD multiplexer 18 to a first read out circuit 30, which converts the photogenerated charge signals to an analog voltage. The analog voltage signals are digitized with an A/D converter and the digital outputs are digitally unscaled in stage 32 according to inputs from controller 12 which contains the K TDI scaling information applied to each pixel in the sensing stage 20. The imaging controller 12 also synchronously provides to FS M×H DBD control circuits 28 scaling information on the number of TDI stages each sensor pixel receives and this is implemented with digital blooming drains (DBD) located inside the bidirectional M×N TDI Imaging CCD. The DBD inside the bidirectional M×N TDI Imaging CCD are controlled and address with the FS M×H DBD control circuit 28, where H is an integer greater than one.

The scaled analog sensor pixel values from the bidirectional M×N TDI Imaging CCD 14 are multiplexed with the second PI/SO CCD multiplexer 24 to a second read out circuit 34, which converts the photogenerated charge signals into analog voltages. The analog voltages are digitized with an A/D converter and digitally unscaled with stage 36. Digital unscaling recovers a digital equivalent of each sensor pixel's footprint brightness signal in the object space and maintains the improved inter sensor pixels' equalized S/N ratios, approximately within 2×. The final image with equalized inter sensor pixels S/N ratios (within 2×, for example) is then provided to the input/output device 16, for example, to be displayed.

In reverse scan, photogenerated charge signals from the RS M×K sensing stages 26 are multiplexed by the second PI/SO CCD multiplexer 24 to the second read out circuit 34, which converts the photogenerated charge signals to an analog voltage. The analog voltage signals are digitized with an A/D converter and the digital outputs are digitally unscaled with stage 36 according to inputs from controller 12 advanced which contains the K TDI scaling information applied to each pixel in the sensing stage 26. The imaging controller 12 also synchronously provides to RS M×H DBD control circuit 22 scaling information on the number of TDI stages each sensor pixel receives and this is implemented with digital blooming drains (DBD) located inside the bidirectional M×N TDI Imaging CCD. The DBD inside the bidirectional M×N TDI IMAGING CCD are controlled and addressed with the RS M×H DBD control circuit 22, where H is an integer greater than one.

The scaled sensor pixel values from the bidirectional M×N TDI Imaging CCD 14 are multiplexed with the first PI/SO CCD multiplexer 18 to the first read out circuit 30, which converts the photogenerated charge signals into analog voltages. The analog voltages are then digitized by an A/D converter and digitally unscaled with stage 32. Digital unscaling recovers a digital equivalent of each sensor pixel's footprint brightness signal in object space and maintains the improved inter sensor pixels' equalized S/N ratios, approximately within 2×. The final image with equalized inter sensor pixel S/N ratios (within 2×, for example) is then provided to the input/output device 16, for example, to be displayed.

Figure 2:
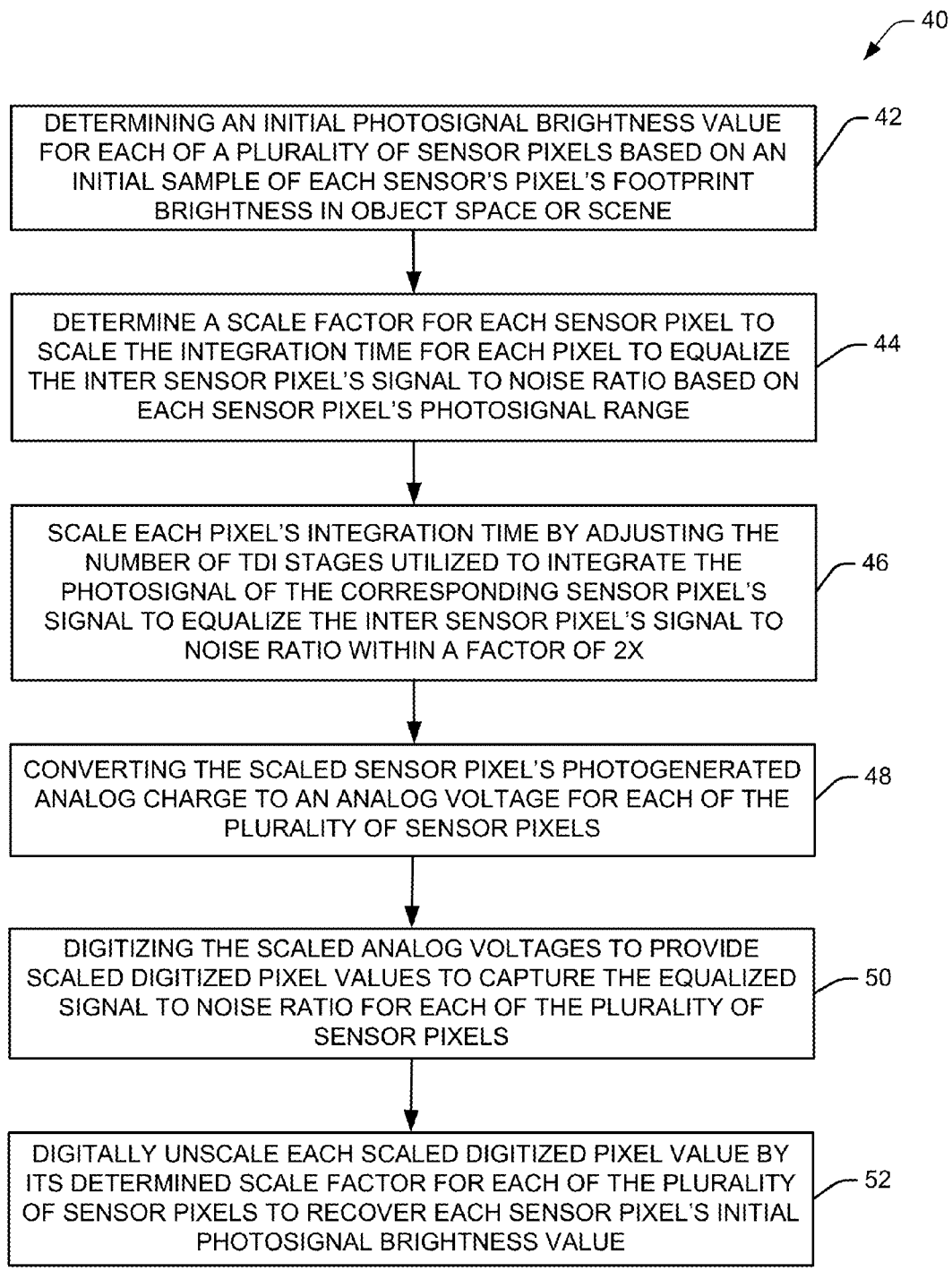
FIG. 2 illustrates an example of method for image capturing of an object scene by a focal plane sensor in a scanning imaging system.

FIG. 2 illustrates a method example for capturing an image of object space (or scene) with a focal plane sensor for a scanning imaging system. The methodology begins at 42 where initial photosignal brightness values are determined for each of a plurality of sensor pixels by an initial sample of each sensor pixel's footprint brightness in object space, or scene. At 44, a scale factor is determined for each sensor pixel to equalize the inter sensor pixels' signal to noise ratios within 2× (approximately). Inter sensor pixels signal to noise ratios equalization is performed by scaling (or adjusting) each sensor pixel's integration time. For each sensor pixel the scale factor is determined from which signal range each sensor pixel's photosignal value occupies. Each sensor pixel's integration time is scaled by adjusting the number of TDI stages applied to a sensor pixel at 46. Scaling the number of TDI per sensor pixel equalize the inter sensor pixels' S/N ratios within a factor of 2×, approximately. At 48, each of the plurality of the sensor pixels' scaled photogenerated analog charge signals are converted to scaled analog voltages. At 50, the scaled analog voltages are digitized to provide scaled digital pixel values, and capturing the equalized (within 2×, approximately) inter pixels signal to noise ratios. At 52, each scaled digitized scaled pixel value is digitally unscaled to recover each sensors pixel's initial photosignal brightness value.

In accordance with one example, five signal ranges have been assigned to sensor pixels' signal values that span from 12 electrons, for the dimmest signals, up to 12,500 electrons, for the brightest signals. Each signal, falling within one of the four lower level signal ranges, is scaled up by variable integration time per pixel into the highest (brightest) sensor pixel signal range. Accordingly, the integration time is increased by varying the number of TDI stages applied to each sensor pixel to correspond to the scaling factors illustrated in TABLE 2 below.

The digital transformation maps five Signal Ranges (column 2, TABLE 3) into a single range between 3,125 and 12,500 electrons (column 6, TABLE 3). This accomplishes two very important things: it equalizes the S/N ratio for all sensor pixels to within approximately 2×, and greatly simplifies A/D conversion by equalizing the LSB (see column 8, TABLE 3). Equalization is achieved with scaling which adjusts each sensor pixel's integration time to map all the five Signal Ranges into one range between 3,125 and 12,500 electrons. Since each sensor pixel's signal obeys Poisson statistics, the mappings equalizes the signal-to noise ratio within the five Signal-to-Noise ratios scene regions. Equalizing the inter sensor pixels' S/N ratios results in bright, average, and dim sensor pixels with the same S/N ratios, approxi-

TABLE 2

| Pixel's Signal Range | Pixel's Signal Range electrons) | Pixel's Noise Range (electrons) | Pixel's S/N Ratio | $4T_{INT}$ Signal Scaling (electrons) | $16T_{INT}$ Signal Scaling (electrons) | $64T_{INT}$ Signal Scaling (electrons) | $256T_{INT}$ Signal Scaling (electrons) |
|---|---|---|---|---|---|---|---|
| 1 | 3,125-12,500 | 56-112 | 56-112 (7 Bits) | 12.5k-50k | 50k-200k | 200k-800k | 800k-3.2M |
| 2 | 782-3,125 | 28-56 | 28-56 (6 Bits) | 3.125k-12.5k | 12.5k-50k | 50k-200k | 200k-800k |
| 3 | 196-782 | 14-28 | 14-28 (5 Bits) | 782-3.125k | 3.125k-12.5k | 12.5k-50k | 50k-200k |
| 4 | 49-196 | 6-14 | 6-14 (4 Bits) | 196-782 | 782-3.125k | 3.125k-12.5k | 12.5k-50k |
| 5 | 12-49 | 3-7 | 3-7 (3 Bits) | 48-196 | 196-782 | 782-3.125k | 3.125k-12.5k |

The first four columns in TABLE 2 correspond to the first four columns in TABLE 1, and all entries are calculated for the same integration time TINT, which corresponds to a 1× scaling. Columns 5, 6, 7, and 8 have been calculated assuming a sensor pixel's integration time was scaled, respectively, by 4×, 16×, 64× and 256×. Each one of the five Signal Ranges in column 2 can be equalized to Signal Range #1 by using the proper scaling factor: Signal Range #2 is scaled by 4×, Signal Range #3 is scaled by 16×, Signal Range #4 is scaled by 64×, and Signal Range #5 is scaled by 256×. Such scaling maps all signals into Signal Range #1 and thereby equalizes all the sensor pixels' S/N ratio within approximately 2×.

In TABLE 2, columns 5, 6, 7, and 8 have been calculated for scaling a sensor pixel's integration time by 4×, 16×, 64× and 256, respectively. Arbitrary scaling a sensor pixel's integration time can lead to saturation. Scaling all sensor pixels' into Signal Range 1 by 16× will result in saturation sensor some sensor pixels. Similarly, scaling sensor pixels in Signal Range 2 (3) by 64× (256×) will also result in sensor pixel saturation. However by selectively applying different scaling to each the five Signal Ranges listed in TABLE 2 map all the signals into Signal Range #1 and thereby equalizes the inter sensor pixels' S/N ratio in all the 5 Signal Ranges. Such a mapping is performed by scaling the four lower Signal Ranges (#2, #3, #4 & #5) by (4×, 16×, 64×, and 256×), respectively, into the Signal Range #1. Such a mapping is shown in TABLE 3, column 6 below.

mately within 2×. Furthermore, scaling simplifies digitization of sensor pixels' signals from large dynamic range scenes.

Figure 3:
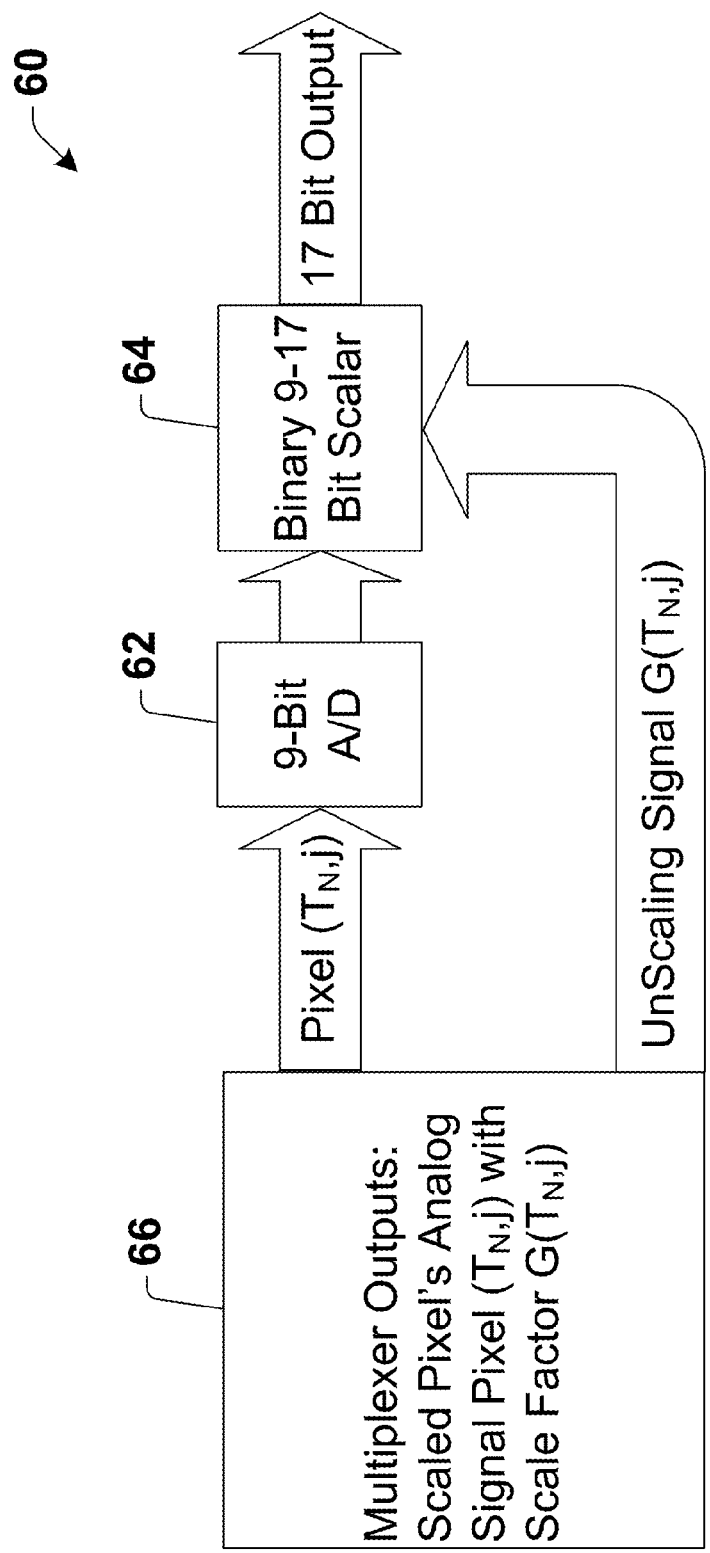
FIG. 3 illustrates an example functional block diagram of an A/D converter and digital unscaling stage.
Figure 4:
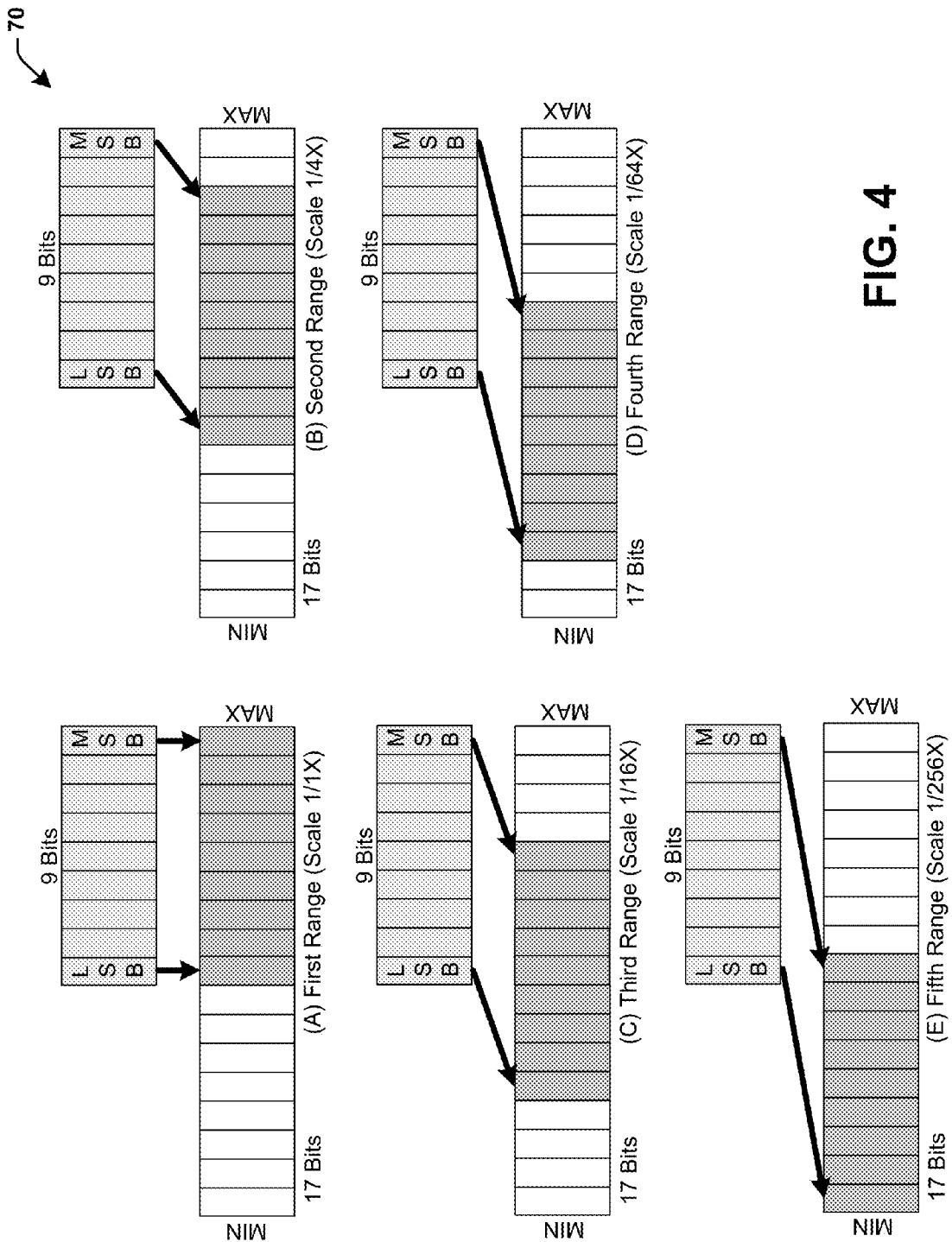
FIG. 4 shows a block diagram of an example register illustrating operations of a digital unscaling arithmetic unit.

As previously stated, the digital transformation technique allows for utilization of an A/D converter with less bits compared to the number of bits needed without employing the digital transformation technique. FIG. 3 illustrates an example functional block diagram of an A/D converter and digital unscaling stage with five sensor pixel signal ranges as illustrated in TABLE 2 and TABLE 3. FIG. 3 illustrates how a conventional 9 bit A/D converter is sufficient to provide a 17 bit digital output by incorporating an 8 bit digital unscaling unit 64 that operates on every sensor pixel. A multiplexer 66, in FIG. 3, generates outputs signals from each sensor's pixel (TN,j) into an A/D converted 62 which digitizes each pixel's analog output with 9 bit. The 9 bit A/D converter 62 output is digitally unscaled with the digital unscaling unit 64 according to a sensor pixel's scale tag G(TN,j), which represents the scaling factor that each sensor pixel has received. FIG. 4 shows a block diagram of an example register that illustrates how digital unscaling is incorporated with the 9 bit A/D, for various scale ranges. Here, the digital unscaling arithmetic unit acts as a divider to remove the effects of scaling (1×, 4×, 16×, 64×, or 256×) applied to each sensor pixel's to equalize the S/N ratio within approximately 2×. This is facilitated by carrying each "sensor pixel's" scale factor tag representing each sensor pixel's amplitude and the same tag provides information that is needed to perform a sensor pixel's unscaling.

TABLE 3

| Signal Range | Un-scaled Signal Range (electrons) | Un-scaled Noise Range (electrons) | Instantaneous S/N (# Bits) Before Scaling | Linear Scale Factor | Scaled Signal Range (electrons) | Instantaneous S/N (# Bits) | Scaled A/D Converter LSB (electrons) |
|---|---|---|---|---|---|---|---|
| 1 | 3,125-12,500 | 56-112 | <8 | 1X | 3,125-12,500 | <9 | 30 |
| 2 | 782-3,125 | 28-56 | <6 | 4X | 3,125-12,500 | <9 | 30 |
| 3 | 196-782 | 14-28 | <5 | 16X | 3,125-12,500 | <9 | 30 |
| 4 | 49-196 | 6-14 | <4 | 64X | 3,125-12,500 | <9 | 30 |
| 5 | 12-49 | 3-7 | <3 | 256X | 3125-12,500 | <9 | 30 |

The A/D architecture shown in FIGS. 3-4 is designed to provide a 17 bit digital output with a nine bit A/D converter coupled to an 8 bit digital unscaling unit. A nine bit A/D converter is suitable because it maps, within five signal ranges, the location of each A/D converter's signal, represented in column 6, TABLE 3, and it is mapped with an instantaneous S/N range that is less than 9 bits. Additionally, this mapping simplifies defining the A/D converter's LSB since in this example it is equal to 30 electrons. Thus each sensor pixel can be digitized with a nine bit A/D, while preserving the improved S/N ratios. This digital transformation is completed by digitally unscaling each sensor pixel's 9 bit digital signal with, for example, an 8 bit scale tag assigned to each sensor pixel. The scale tag assigned to each sensor pixel represents the scale factor (1×, 4×, 16×, 64×, or 256×) used to equalize the S/N ratio by mapping five Signal Ranges into one. Division by the modulo "2" sensor pixel's scale tag is readily performed by shifting the 9 bit A/D output down into a 17 bit output register. The 9 bit sensor pixel's output is shifted to the left based on sensor pixel's scale tag, as is illustrated in FIG. 4.

This digital transformation technique presented applies to focal plane sensor intended for scanning systems imaging high dynamic range scenes. It applies to imaging focal plane sensor using quantum detectors operating in different spectral bands, including: UV, visible, SWIR, MWIR, and LWIR. However, the embodiment of the digital transformation depends on the focal plane sensor's operating spectral band.

Figure 5:
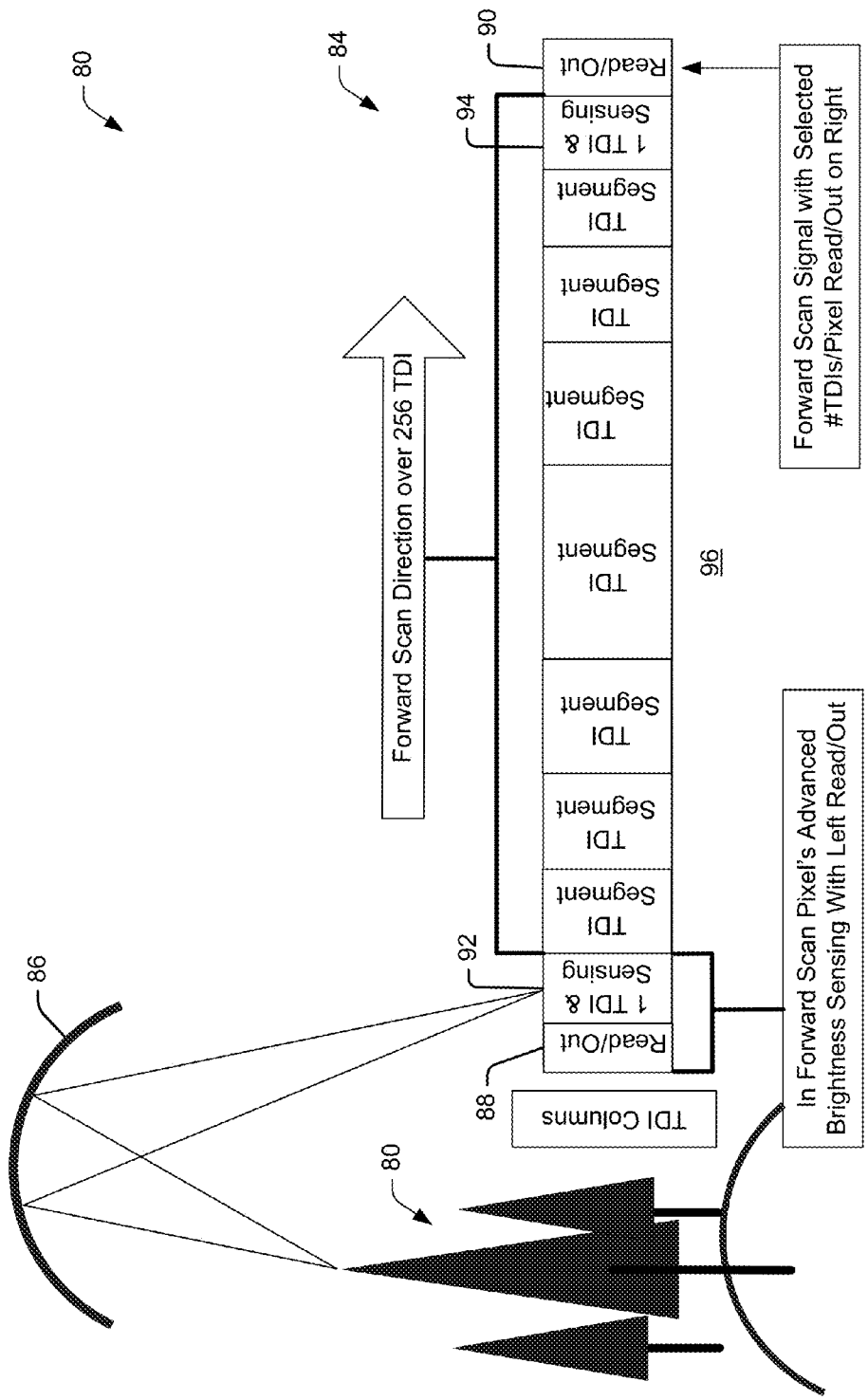
FIG. 5 illustrates an example of a TDI column with sensing stages at both ends and which are used to detect each sensor pixel's brightness when imaging an object space (or scene) with a focal plane sensor.

FIG. 5 illustrates an example of object space (or scene) 82 imaged with scanning operation 80. The object space 82 is scanned via an oscillating mirror 86 and scans the object space image across an array of imaging columns 84 (only one is shown) containing TDI segments, where each TDI segments may have a different number of TDI stages. In the forward scan direction the object space 82 is scanned with a mirror from left-to-right. Such a scan produced an image of the object space within the TDI column 96. The image produced in the TDI column 96 moves synchronously with the scanned image by adjusting the speed of the TDI-CCD transfer clocks. In the reverse scan direction, the object scene 82 is scanned from right-to-left and moves synchronously with image of object space within the TDI column 96. Movement of the object space image within the TDI column is controlled by the speed of the TDI-CCD transfer clocks.

A PI/SO CCD R/O register 88 is located at a first end of the imaging column 84 and a second PI/SO CCD R/O register 90 is located at a second end of the imaging column. Both are used for reading out the sensor pixel signal formed in a TDI-CCD imaging columns 96 (only one column shown). In forward scan, each sensor pixel's brightness is readout with the left CCD R/O register 88 and this provides advanced knowledge of each sensor pixel's brightness. This knowledge determines how many TDI stages are applied to each sensor pixel to equalize the inter sensor pixel S/N ratio within 2×, approximately. The image is readout with the CCD R/O register 90 on the right. In reverse scan, the right CCD R/O register 90 is used for reading out advanced knowledge of each sensor pixel's brightness. This knowledge determines how many TDI stages are applied to each sensor pixel to equalize the inter sensor pixel S/N ratio within 2×, approximately. The image is readout with the CCD R/O register 88, on the left.

Advanced knowledge of each sensor pixel's photosignal is obtained by reading a single TDI sensing stage 92 and 94 on the left and right sides of the TDI imaging column 96, as illustrated in FIG. 5. The single TDI sensing stages are on the left and right sides of the TDI imaging column 96 (and next to each R/O PI/SO register 88 and 90) and are clocked independently of the TDI imaging column 96. In a forward scan operation, the object space image is first scanned across the left single TDI sensing stage 92 before it is scanned over and imaged with the remaining TDI stages on the right. In the forward scan, the object space image is Read/Out with the R/O PI/SO register 90 on the right. In reverse scanning sequence, the image is first scanned across the right single TDI sensing stage 94 before it is scanned and imaged with the remaining TDI stages on the left. In the reverse scan, the right single TDI sensing stage 94 is Read/Out with the R/O PI/SO register 90 on the right. In a reverse scan, the object space image is scanned over and imaged with the remaining TDI stages on the left. In reverse scan, the object space image is Read/Out with PI/SO registers 88, located on the left. Given the image scanning sequence in both directions, Read/Out of the single TDI sensing stage (containing each sensor pixel's photosignal amplitude) occurs before object space is imaged with the TDI columns and Read/Out. Thus, the scanning sequence in each direction insures that sufficient advanced knowledge of each sensor pixel's photosignal value is available to allow time for adjusting the number of TDI stages per each sensor pixel.

Figure 6:
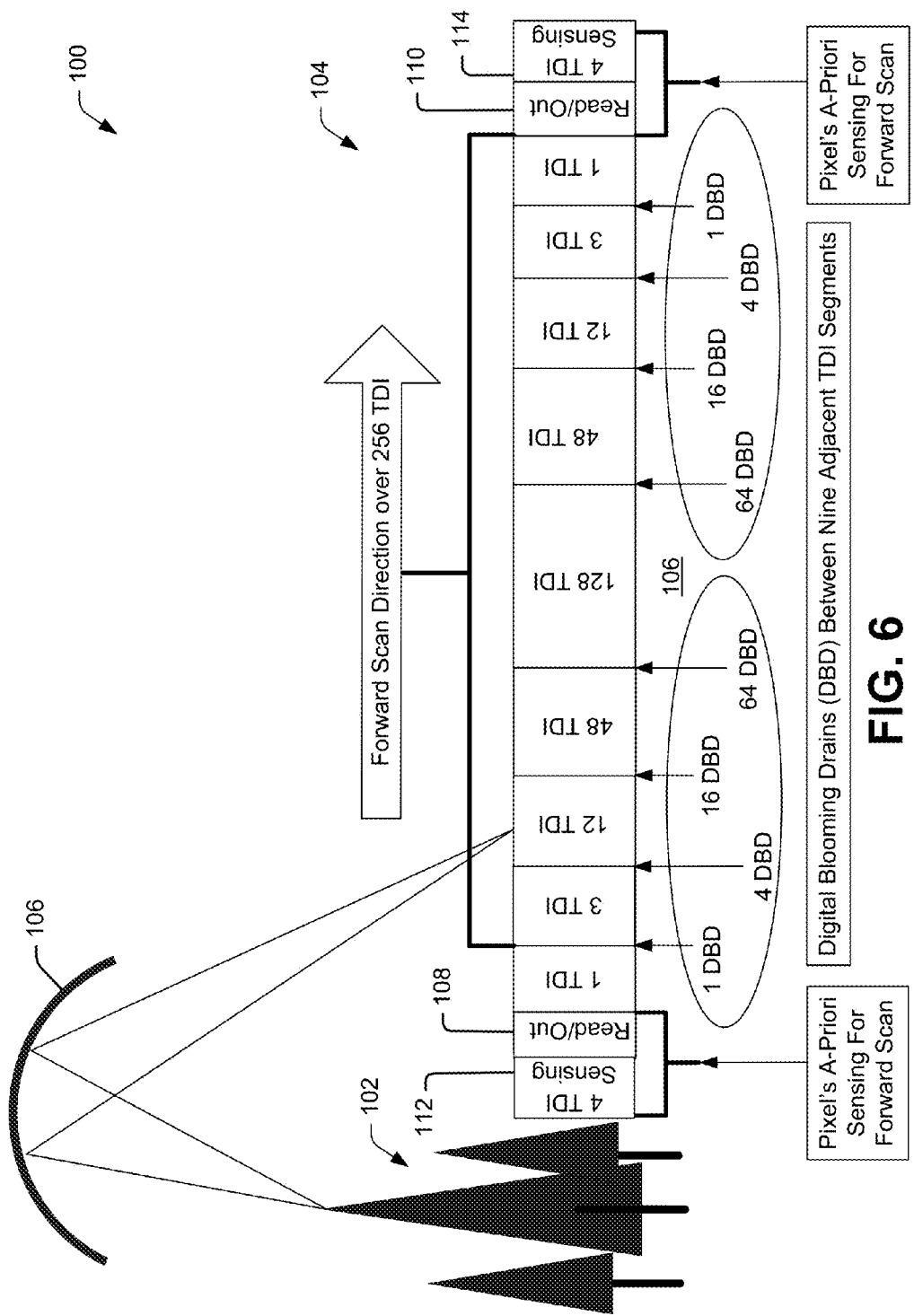
FIG. 6 illustrates another example of a TDI column with 4-TDI sensing stages on the left and right sides of the Read/Outs and which are used to detect each sensor pixel's brightness when imaging object space (or scene) with scanning focal plane sensor.

Advance knowledge of each sensor pixel's photosignal can be obtained with improved sensitivity by using the approach shown in FIG. 6. FIG. 6 illustrates another example of object space (or scene) 102 imaged with scanning operation 100. As illustrated in FIG. 6, an object space 102 is scanned with an oscillating mirror 106 and produces an image of the object space across an array of imaging columns 104 (only one is shown without detectors) containing TDI segments, where each TDI segments may have a different number of TDI stages. In the forward scan direction, the object space (or scene) 102 is scanned with a mirror from left-to-right. Such a scan produces an image of the object space within the TDI column 116. The image produced within the TDI column 116 moves synchronously with the scanned image by adjusting the TDI-CCD transfer clocks. In the reverse scan direction, the object space (or scene) 102 is scanned from right-to-left and moves synchronously with the object space image within the TDI column 116. Movement of the object space image within the TDI-column is controlled by the TDI-CCD transfer clocks. A PI/SO CCD R/O register 108 is located at a first end of the imaging column 104 and a second PI/SO CCD R/O register 110 is located at a second end of the imaging column 104 and these are used for reading out the sensor pixel signal formed in a TDI-CCD imaging columns 116 (only one is shown).

In forward scan, the left CCD R/O register 108 is used for readout of each sensor pixel's brightness signal 112 to provide advanced knowledge of each sensor pixel's brightness value. This information is used to determine how many TDI stages are applied to each sensor pixel to equalize the inter sensor pixels' S/N ratio within 2×, approximately. The object space is imaged with the TDI-CCD imaging column located between the two R/Os 108, and 110, and is readout with the CCD R/O register 110 on the right In reverse scan, the right CCD R/O register 110 is used for readout of each sensor pixel's brightness signal 114 to provide advanced knowledge of each sensor pixel's brightness value. This information is used to determine how many TDI stages are applied to each sensor pixel to equalize the inter sensor pixels' S/N ratio within 2×, approximately. The object space is imaged with the TDI-CCD imaging column located between the two Read/Outs 108, and 110 and is readout with the CCD R/O register 108 on the left.

For forward scan, 4 TDI sensing stages 112 are placed on the left side of the left R/O PI/SO CCD register 108. For reverse scan, 4 TDI sensing stages 114 are placed on the right side of the right R/O PI/SO CCD register 110. Such placement provides room for several TDI sensing stages and TDI scanning compatibility. It is to be appreciated that the R/O PI/SO CCD registers 108 and 110, shown in FIG. 6 need to be designed to accept charge signals from two sides instead of just one side. Specifically, in forward scan, the 4 TDI sensing stages 112 injects signal charge from the left into R/O PI/SO CCD register 108. Concurrently, in forward scan the TDI image charge signals (formed in the column with several TDI segments) are injected into the left side of the R/O PI/SO CCD register 110. Specifically, in reverse scan, the 4 TDI sensing stages 114 inject signal charge from into right into the R/O PI/SO CCD register 110. Concurrently, in reverse scan the TDI image charge signals (formed in the column with several TDI segments) are injected into the right side of the R/O PI/SO CCD register 108.

The advanced knowledge sensing stages' information on each sensor pixel's photosignal is used for calculating the number of TDI stages applied to each sensor pixel. Adjusting the number of TDI per sensor pixel can be implemented by including in each TDI-CCD imaging column two types of antiblooming drains. One type of antiblooming drain can be incorporated in every one or other TDI stage in the imaging columns. This type of antiblooming stage has a global antiblooming level adjustment which prevents signal charge blooming when imaging large dynamic range scene. A second type of antiblooming stage in the TDI-CCD imaging column is called a digital blooming stage, or DBD.

The digital blooming stage has two operating modes: (1) it can function as a regular antiblooming stage, and (2) or, if directed, it can empty the signal charge contained within a given TDI-CCD stage. Thus, a sensor pixel's signal charge which accumulates as the sensor pixel's signal is shifted down the TDI-CCD imaging column can be reset to zero by a voltage pulse applied to the digital blooming stage located wherein the sensor pixel's signal charge is located. Thus, the number of TDI stages the sensor pixel's charge receives is limited to the number of TDI-CCD stages remaining in a column before the sensor pixel's charge is transferred into the R/O PI/SO CCD registers used for reading out the object space image obtained with the TDI-CCD column. The terms "blooming" and "antiblooming" are deemed synonymous throughout this document.

Eight digital antiblooming stages are shown in the TDI imaging column 116 of FIG. 6. For the forward scan direction, four digital antiblooming drains are located on the right side of the TDI imaging column 116. For the reverse scan direction, four digital antiblooming drains are located on the left side of the TDI imaging column 116. Thus eight digital antiblooming drains are located within the nine TDI segments and are symmetrically inserted within each TDI imaging column. The number of TDIs a sensor pixel receives is varied according to which digital antiblooming drain stages are addressed as a sensor pixel traverses within the 256 stage TDI column during imaging.

In the example of FIG. 6, a sensor pixel receives 256 TDI if none of the forward (reverse) digital antiblooming drains are addressed as a sensor pixel moves in the forward (reverse) scan direction within the 256 stage TDI imaging column. A sensor pixel receives 64 TDI if only digital antiblooming drain forward (reverse) 64 DBD is addressed as a sensor pixel moves the forward (reverse) scan direction within the 256 stage TDI imaging column. A sensor pixel receives 16 TDI if only digital antiblooming drain 16 DBD forward (reverse) is addressed as a sensor pixel moves in the forward (reverse) scan direction within the 256 stage TDI imaging column. A sensor pixel receives 4 TDI if only digital antiblooming drain 4 DBD forward (reverse) is addressed as a sensor pixel moves in the forward (reverse) scan direction within the 256 stage TDI imaging column. A sensor pixel receives 1 TDI if only digital antiblooming drain 1 DBD forward (reverse) is addressed as a sensor pixel moves in the forward (reverse) scan direction within the 256 stage TDI imaging column.

Each digital blooming drain stages are located within each TDI column and are individually addressed by a digital voltage pulse or reset pulse. When the digital blooming drain stage is addressed by a digital voltage pulse, the charge signal of a sensor pixel located within the TDI stage with digital blooming drain is reset to zero. If the digital blooming drain stage is not addressed, the sensor pixel's charge signal is incremented by one TDI. Thus, the number of TDI stages a sensor pixel receives depends on the action of the digital blooming drain stages on the sensor pixel's signal. In the forward (reverse) scan, a sensor pixel is transferred within the 256 stage imaging TDI column and the number of TDI it receives depends by which of digital blooming drain on the right (left) side reset it's the signal charge. If a sensor pixel's signal charge is not reset as it is transferred in the 256 stage long TDI column, it will receive 256 TDIs. If a sensor pixel's charge signal in the forward (reverse) scan is reset by the right (left) side digital blooming drains (64 DBD, 16 DBD, 4 DBD, or 1 DBD) it will receive, respectively, (64TDI, 16TDI, 4TDI, or 1TDI).

FIG. 7 illustrates an example block diagram of a four phase TDI cell 130 representing a TDI stage. The TDI cell 130 size can be about 20 μm×20 μm for use with a SWIR, MWIR, or LWIR photodetectors. The TDI cell 130 can include a 10 μm wide by 20 μm long four phase TDI-CCD shift register stage 132. The signal from a photodetector is electrically injected into a direct injection source 134, and flows under a direct injection gate 136 into an integration well 138. Photocharge integrated in the integration well is limited by a blooming gate 140, which double as a reset gate when this structure functions as a digital blooming drain and removes all the charge from the integration well 138 into a blooming drain 142. Photocharge can be injected from the integration well 138 into the TDI-CCD shift register stage 132 by action of a charge injection gate 144. Photocharge can be moved between different TDI stages with the TDI-CCD shift register stage 132 by clocking the TDI-CCD shift register phases with clock signals.

Each photodetector has a terminal common with all the photodetectors in an array and a second isolated terminal which is electrically connected to the DI source 134, shown in FIG. 7. Injected photosignal flows under the DI gate 136 into an integration well 138. Photosignal is integrated in the integration well 138 defined by channel stops 146, and the confining voltage potentials applied to the integration well 138, the blooming & reset gate 140, the DI gate 136 and the charge injection gate 144. Antiblooming is achieved by adjusting the blocking voltage applied to the blooming & reset gate 140 and thereby limiting how much charge can be integrated in the integration well 138. The potential of charges integrated in the integration well 138 increases as charge builds-up until it equals to the potential barrier formed by the blooming & reset gate 140. Any additional charge injected into the integration well 138 is no longer confined and flows under the blooming & reset gate 140 into the blooming drain 142. The blooming drain 142 is connected to a potential which attracts the charge flowing under the blooming & reset gate 140. This prevents charge blooming from the integration well 138 into the TDI-CCD register 132. Similarly, charge in the TDI-CCD register 132 is prevented from blooming by adjusting the blocking potential applied to the charge injection gate 144 to be less blocking than the blocking potential applied to the 4 Phase TDI-CCD register 132.

Digital Antiblooming can be used to remove all the charge from the integration well 138 and the potential well of the 4 Phase TDI-CCD register 132 located next to the charge injection gate 144. This is achieved by applying a non-blocking potential to the blooming & reset gate 140 and the charge injection gate 144. This drains all the charge into the blooming drain 142 and determines the number of TDIs applied to a sensor pixel. After the charge removal, the potential applied to the charge injection gate 144 and blooming & reset gate 140 are biased into their antiblooming levels. Charge Injection from the integration well 138 into a potential well inside the 4 Phase TDI-CCD register 132 is performed by applying a non-blocking potential to the charge injection gate 144, and making the integration well 138 less attractive to promote charge flow from the integration well 138 into the 4 Phase TDI-CCD well. After the charge is injected from the integration well 138, the charge injection gate 144 is biased into its normal blocking potential.

The digital transformation approach is valid for imaging large dynamic range scenes in different spectral bands, including: UV, Visible, SWIR, MWIR and LWIR FPAs. Because of maturity differences in detector material technology, the optimal FPA configuration/architecture approach depends on the spectral band selected. However, unlike the detector materials, silicon is the preferred material for focal plane signal processing signal in terms of maturity, cost, and performance. Thus, silicon is the likely material of choice for fabricating a Read Out Integrated Circuit (ROIC) for the different spectral band bands, provided adjustments are made for the detector material maturity.

Figure 8:
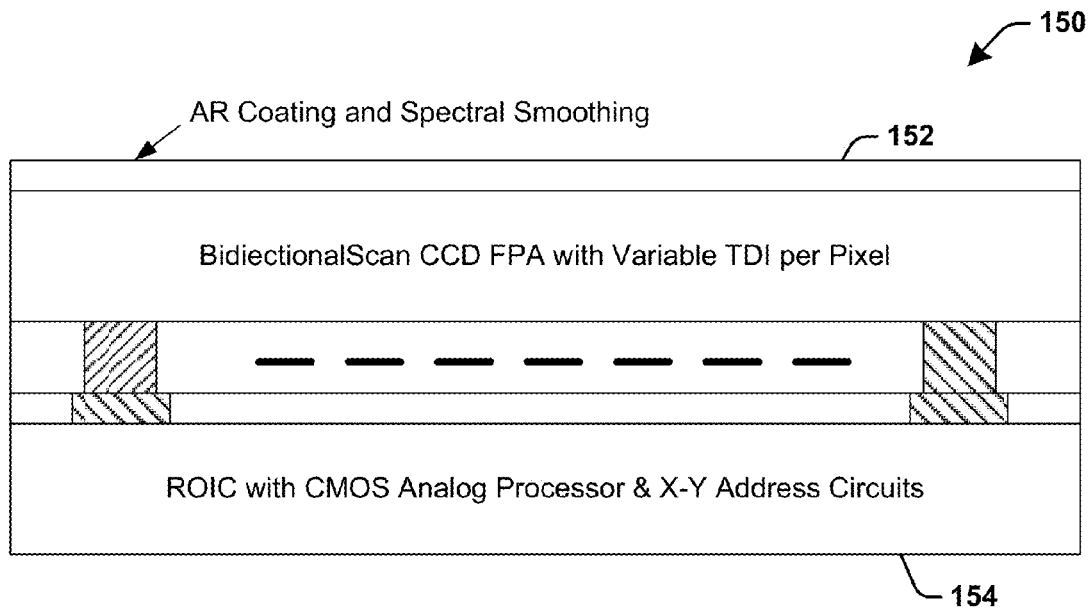
FIG. 8 illustrates an example of a hybrid assembly of scanning focal plane sensor for a scanning imaging system.

FIG. 8 illustrates an example of an imaging focal plane sensor 150 formed from a back side imaging (BSI) bidirectional scan TDI-CCD Focal Plane Array 152 bonded to a silicon ROIC 154. Bonding between UV or Visible TDI-CCD FPA and ROIC can employ Indium Bump Bonding or Wafer Bonding. For maximum fill factor, the UV or Visible photodetector arrays are AR coated to operate in a Back Side Imaging configuration. The focal plane sensor features variable TDI for each sensor pixel to achieve maximum sensitivity by equalizing the inter sensor pixels' S/N ratio within 2×, approximately. Silicon UV and Visible scanning sensors imaging high dynamic range scenes potentially offer the lowest cost and best performance. Silicon photodetectors absorbs UV and Visible photons. Thus, the UV and Visible photodetector and ROIC can be made in silicon. This leads to better sensitivity since integrating the photodetectors and the TDI-CCD processors avoids electrical injection noise and replacing it with directly photogenerating charge signals within the TDI-CCD potential wells. Thermal expansion mismatch issues are also avoided by making the focal plane sensor TDI-CCD and the ROIC in silicon.

Figure 9:
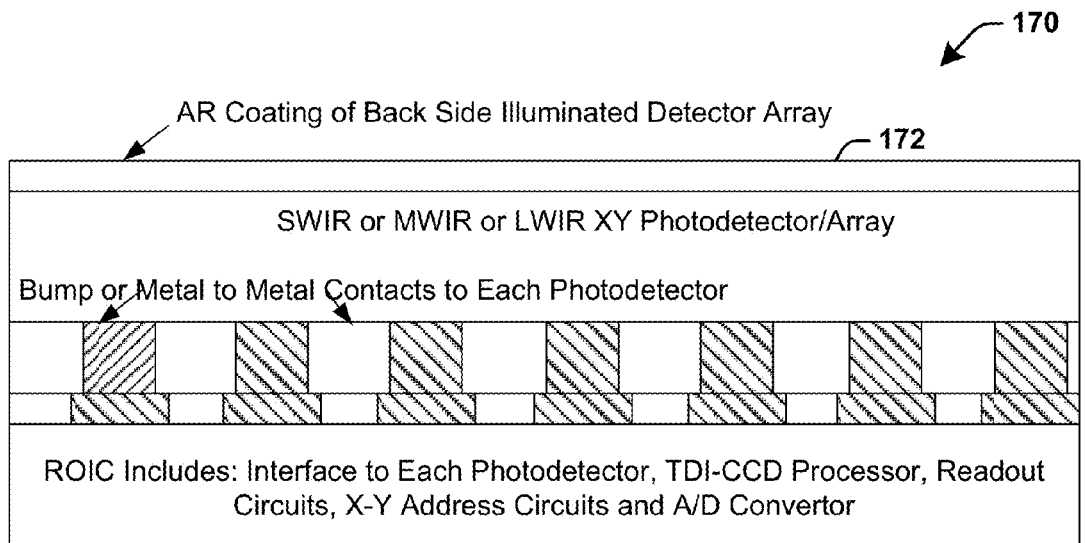
FIG. 9 illustrates another example of a hybrid assembly of a scanning focal plane sensor for a scanning imaging system.

FIG. 9 illustrates an example of an imaging focal plane sensor 170 formed from a SWIR, or MWIR, or LWIR, photodetector FPAs 172 connected to a ROIC 174. For maximum fill factor, the SWIR or MWIR, or LWRI photodetector FPA 172 is AR coated and operates in Back-Side-Imaging mode. The SWIR, or MWIR, or LWIR ROIC 174 features variable TDI per each sensor pixel and electrical interface circuits between each photodetector and ROIC. Intrinsic SWIR, MWIR or LWIR photodetectors are typically made in InGaAs (for SWIR) InSb or HgCdTe (for MWIR) and HgCdTe (for LWIR). The technology in these materials is not sufficiently developed to make high quality TDI-CCD, which would allow integration of the photodetectors with the TDI-CCD processor. Hence, signals from such photodetectors are electrically (not optically as with UV and Visible photons) injected into a silicon TDI-CCD with a special injection structure and this requires electrical connection between ROIC and each photodetector, as is illustrated in FIG. 9.

Direct Injection is the simplest electrical coupling structure between photodetector and TDI-CCD. More complicated electrical coupling structures, like buffered direct injection and transimpedance amplifier, can be used to obtain better injection performance. Thus, the sensor focal plane architecture of SWIR, or MWIR or LWIR is significantly impacted since all the signal processing has to be performed in the Silicon ROIC. Each photodetector in a SWIR, or MWIR or LWIR array 172 is electrically connected to an injection structure with bump bonding or direct wafer bonding to the ROIC 174, which includes a TDI-CCD processor, and electrical injection structures. The high density interconnections between photodetectors and ROIC are consistent with existing bump bonding or wafer bonding technology. However, the electrical interface between each photodetector and TDI-CCD add injection noise and this may impact performance at the lowest signal levels.

The ROIC 174 for SWIR, or MWIR, or LWIR photodetector arrays includes: electrical interface to each detector, digital antiblooming drain stages, regular antiblooming drain stages, TDI-CCD stages, CMOS A/D converter, X-Y address stages, and Read Out circuits. Integrating these functions is possible with high density silicon lithography, and this is partly mitigated because the diffraction limit for SWIR, MWIR and LWIR is larger than for UV and Visible. Hence the sensor pixel's foot print for SWIR, MWIR and LWIR photodetectors is at least 2× larger than the sensor pixel's size for UV and Visible photodetectors. As a result, more room is available for integrating: the electrical coupling circuit between each photodetector and the ROIC 174, the digital antiblooming drains, the regular digital antiblooming drains, and the TDI-CCD registers. The readout circuits, the CMOS A/D converter and the drive for the X-Y address circuits are not located within the sensor pixel area hence they do not significantly impact the ROIC's circuit density requirements. The increased circuit density requirement is compatible with existing CMOS circuit densities.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations.

What is claimed is:

1. A scanning focal plane sensor for an imaging system comprising:
 a M×N time delay integration (TDI) imaging charge coupled device (CCD), where M is a number of sensor pixels and N is a number of TDI stages per sensor pixel, and M and N are integers greater than one; and
 an imaging controller configured to determine an initial photosignal value for each sensor pixel based on an initial capture of an image of an object scene, and select a number of TDI stages for integrating charge of each respective sensor pixel of the image based on its respective initial photosignal value.

2. The focal plane sensor of claim 1, wherein the imaging controller determines a scale factor for each sensor pixel, based on the initial photosignal value, that scales each initial photosignal value into a same photosignal value range, the scale factor determines the number of TDI stages selected for integrating charge of each sensor pixel.

3. The focal plane sensor of claim 2, further comprising a readout circuit that converts each integrated charge into an analog voltage and an analog/digital converter that digitizes each analog voltage to provide a digitized sensor pixel photosignal value for each sensor pixel, the digitized sensor pixel photosignal value for each sensor pixel being unscaled by its respective scale factor to recover its initial photosignal value, while maintaining a signal to noise ratio that is approximately within approximately a factor of 2 for each sensor pixel.

4. The focal plane sensor of claim 3, wherein the analog/digital converter outputs an X bit word representing the scaled digitized sensor pixel's photosignal value into a Y bit register, where X and Y are integers greater than one and Y is greater than X, wherein the bits of the register are shifted to perform unscaling based on the scale factor associated with a given sensor pixel to recover its initial photosignal value.

5. The focal plane sensor of claim 2, wherein initial photosignal values fall within one of a plurality of photosignal value ranges, where each sensor pixel's scale factor scales its initial photosignal value into a brightest photosignal value range of the plurality of photosignal value ranges.

6. The focal plane sensor of claim 1, further comprising M×K sensing stages, where K is an integer equal to or greater than one, from where the imaging controller obtains the initial photosignal value from a sensing stage associated with a given sensor pixel for each sensor pixel.

7. The focal plane sensor of claim 6, further comprising a parallel-in/serial out (PI/SO) CCD multiplexer that multiplexes integrated charge of each respective sensor pixel to a readout circuit that converts each integrated charge into an analog voltage and an analog/digital converter that digitizes each analog voltage to provide a digitized representation of each sensor pixel photosignal value, the digitized representation of each sensor pixel photosignal value being digitally unscaled by its respective scale factor to recover its initial photosignal value, while maintaining a signal to noise ratio that is within approximately a factor of 2 for each sensor pixel.

8. The focal plane sensor of claim 1, wherein each TDI stage comprises a TDI cell that integrates charge from a photodetector in an integration well and injects the charge into a TDI-CCD well, the charge in the TDI-CCD well is integrated with charge accumulated from previous TDI-CCD stages, each TDI cell further comprises a reset gate that removes the charge from the integration well and the TDI-CCD well in response to a reset control signal, the imaging controller selecting a number of TDI stages by providing a reset control signal to a TDI stage that is prior to the selected TDI stages.

9. The focal plane sensor of claim 8, wherein the reset gate is a digital blooming (DBD) and reset gate associated with each sensor pixel, and further comprising M×H DBD control reset signals coupled to H selected TDI stages out of the N TDI stages in a column for each sensor pixel to define a plurality of TDI segments that when selected provide respective integration times by resetting one or more TDI stages in one or more previous TDI segments that allow for scaling of initial photosignal values into a same photosignal value range for each of the M sensor pixels, where H is an integer greater than or equal to one.

10. The focal plane sensor of claim 1, wherein the M×N TDI imaging CCD is focal plane array that is wafer bonded to a silicon read out integrated circuit (ROIC) that includes the imaging controller.

11. The focal plane sensor of claim 1, wherein the M×N infrared (IR) photodetector array that is wafer bonded or bump bonded to a read out integrated circuit (ROIC) that includes a M×N TDI imaging CCD and the imaging controller.

12. The focal plane sensor of claim 1, wherein the M×N TDI imaging CCD is a bidirectional imaging CCD.

13. A scanning imaging focal plane sensor configured to perform a forward and a reverse scan operation, the focal plane sensor comprising:
a bidirectional M×N time delay integration (TDI) imaging charge coupled device (CCD), with one detector connected to each TDI stage, where M is a number of columns, and N is a number of TDI stages in each column used to scale the integration time per each sensor pixel, and M and N are integers greater than one;
M×K sensing stages, where K is an integer greater than one, wherein a first set of sensing stages for each of the M sensor pixels resides on a first side of the bidirectional M×N TDI imaging CCD and a second set of sensing stages for each of the M sensor pixels resides on a second side of the bidirectional M×N TDI imaging CCD; and
an imaging controller configured to determine an initial photosignal value for each sensor pixel based on an initial capture of an image of an object space (or scene) from the first sensing stages during a forward scan, and to determine an initial photosignal value for each sensor pixel based on an initial capture of an image of an object scene from the second sensing stages during a reverse scan, the imaging controller selecting a number of TDI stages for integrating charge of each respective sensor pixel for the respective image based on its respective initial photosignal value.

14. The focal plane sensor of claim 13, wherein the imaging controller determines a scale factor for each sensor pixel, based on the initial photosignal value, that scales each initial photosignal value into a same photosignal value range, the scale factor determines the number of TDI stages selected for integrating charge of each sensor pixel.

15. The focal plane sensor of claim 13, further comprising a first parallel-in/serial out (PI/SO) CCD multiplexer that resides on a first side of the bidirectional M×N TDI imaging CCD and a second PI/SO CCD multiplexer that resides on a second side of the bidirectional M×N TDI imaging CCD, the first multiplexer multiplexes integrated charge from the first set of sensing stages for each sensor pixel to a first readout circuit, and the second multiplexer multiplexes integrated charge from the selected TDI stages for each sensor pixel to a second readout circuit during a forward scan operation, and the second multiplexer multiplexes integrated charge from the second set of sensing stages for each sensor pixel to the second readout circuit, and the first multiplexer multiplexes integrated charge from the selected TDI stages for each sensor pixel to the readout circuit during a reverse scan operation.

16. The focal plane sensor of claim 15, wherein the first set of sensing stages resides between the first PI/SO CCD multiplexer and the first side of the bidirectional M×N TDI imaging CCD and the second set of sensing stages resides between the second PI/SO CCD multiplexer and the second side of the bidirectional M×N TDI imaging CCD.

17. The focal plane sensor of claim 16, wherein the first PI/SO CCD multiplexer resides between the first set of sensing stages and the first side of the bidirectional M×N TDI imaging CCD and the second PI/SO CCD multiplexer resides between the second set of sensing stages and the bidirectional M×N TDI imaging CCD, the first and second PI/SO CCD multiplexers being configured to accept inputs from both the sensing stages on one side and the bidirectional M×N TDI imaging CCD on the opposite side.

18. The focal plane sensor of claim 15, wherein the first readout circuit converts the integrated charge to an analog voltage and provides the analog voltage to a first analog/digital converter that digitizes each analog voltage to provide a digitized sensor pixel photosignal value for each sensor pixel, and the second readout circuit converts the integrated charge to an analog voltage and provides the analog voltage to a second analog/digital converter that digitizes each analog voltage to provide a digitized sensor pixel photosignal value for each sensor pixel, the digitized sensor pixel photosignal value for each sensor pixel being unscaled by its respective scale factor to recover its initial photosignal value, while maintaining a signal to noise ratio that is within a factor of approximately 2 for each sensor pixel.

19. The focal plane sensor of claim 18, wherein each of the first and second analog/digital converter outputs an X bit word representing the digitized sensor pixel photosignal value of a sensor pixel into a Y bit register, where X and Y are integers greater than one and Y is greater than X, wherein the bits of the register are shifted during the unscaling based on the scale factor associated with a given sensor pixel to recover its initial photosignal value.

20. The focal plane sensor of claim 13, wherein each TDI stage comprises a TDI cell that integrates charge from a photodetector in an integration well and injects the charge into a TDI-CCD well, the charge in the TDI-CCD well is integrated with charge accumulated from previous TDI-CCD stages, each TDI cell further comprises a reset gate that removes the charge from the integration well and the TDI-CCD well in response to a reset control signal, the imaging controller selecting a number of TDI stages by providing a reset control signal to a TDI stage that is prior to the selected TDI stages.

21. The focal plane sensor of claim 20, wherein the reset gate is a digital blooming (DBD) and reset gate associated with each sensor pixel, and further comprising a first and second set of M×H DBD control reset signals coupled to H selected TDI stages in each column with N TDI stages for each sensor pixel to define a plurality of TDI segments that when selected provide respective integration times by resetting one or more TDI stages of one or more previous TDI segments that allow for scaling of initial photosignal values into a same photosignal value range for each of the M sensor pixels, where H is an integer greater than or equal to one, the first set of M×H DBD control reset signals being employed during a reverse scan operation, and the second set of M×H DBD control reset signals being employed during a forward scan operation.

22. A method for image capturing of an object space by a scanning imaging focal plane sensor, the method comprising:
  determining an initial photosignal value for each of a plurality of sensor pixels based on an initial capture of an image of an object scene;
  determining a scale factor for each sensor pixel to increase the integration time for each sensor pixel to scale each sensor pixel's photosignal value into a value that falls within a predetermined sensor pixel signal range; and
  adjusting the integrating time of each sensor pixel of the image by a number of time delay integration (TDI) stages corresponding to its determined scale factor to equalize each of the sensor pixel values within the predetermined sensor pixel signal range and provide a signal to noise ratio for each of plurality of sensor pixels that is within a factor of 2.

23. The method of claim 22, further comprising:
  converting the integrated charge to an analog sensor pixel value for each of the plurality of sensor pixels;
  digitizing the analog scaled values into digitized sensor pixel values for each of the plurality of sensor pixels; and
  unscaling each digitized sensor pixel value by its respective scale factor for each of the plurality of sensor pixels to recover each sensor pixel's initial photosignal value.

24. The method of claim 23, wherein each initial photosignal value falls within one of a plurality of photosignal value ranges, where each sensor pixel's scale factor scales its initial photosignal value into a brightest photosignal value range of the plurality of photosignal value ranges.

* * * * *